United States Patent
Okubo et al.

(10) Patent No.: US 12,464,952 B2
(45) Date of Patent: Nov. 4, 2025

(54) MAGNETOSTRICTIVE MEMBER AND METHOD FOR MANUFACTURING MAGNETOSTRICTIVE MEMBER

(71) Applicant: SUMITOMO METAL MINING CO., LTD., Tokyo (JP)

(72) Inventors: Kazuhiko Okubo, Ome (JP); Kazutaka Osako, Ome (JP); Kiyoshi Izumi, Ome (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 0 days.

(21) Appl. No.: 18/276,174

(22) PCT Filed: Feb. 4, 2022

(86) PCT No.: PCT/JP2022/004487
§ 371 (c)(1),
(2) Date: Aug. 7, 2023

(87) PCT Pub. No.: WO2022/172876
PCT Pub. Date: Aug. 18, 2022

(65) Prior Publication Data
US 2024/0099146 A1    Mar. 21, 2024

(30) Foreign Application Priority Data
Feb. 9, 2021 (JP) .................... 2021-019133

(51) Int. Cl.
*H10N 35/85* (2023.01)
*C30B 29/52* (2006.01)
(Continued)

(52) U.S. Cl.
CPC ............ *H10N 35/85* (2023.02); *C30B 29/52* (2013.01); *H01F 1/147* (2013.01); *H01F 1/16* (2013.01); *H01F 41/02* (2013.01); *H10N 35/01* (2023.02)

(58) Field of Classification Search
None
See application file for complete search history.

(56) References Cited

U.S. PATENT DOCUMENTS

2008/0011390 A1\* 1/2008 Clark ................... H10N 35/85
                                                                148/306
2013/0140919 A1    6/2013 Ueno et al.
(Continued)

FOREIGN PATENT DOCUMENTS

| JP | H04-108699 A | 4/1992 |
|----|----|----|
| JP | 2015-517024 A | 6/2015 |
| JP | 2016-028831 A | 3/2016 |
| JP | 2016-138028 A | 8/2016 |
| JP | 2018-203585 A | 12/2018 |

(Continued)

OTHER PUBLICATIONS

State of the Art of Galfenol Processing, Materials Research Group—EPI, Etrema Products, Inc.. (38 pages); cited in the specification.
(Continued)

*Primary Examiner* — Seth Dumbris
(74) *Attorney, Agent, or Firm* — WHDA, LLP

(57) ABSTRACT

The magnetostrictive member is formed of a single crystal of an iron-based alloy having magnetostrictive characteristics, is a plate-like body having a long-side direction and a short-side direction, and has a lattice constant of a <100> orientation in the long-side direction not larger than a lattice constant average calculated from lattice constants of <100> orientations in three directions, or the long-side direction, the short-side direction, and a direction orthogonal to the long-side direction and the short-side direction.

6 Claims, 7 Drawing Sheets

(51) Int. Cl.
  *H01F 1/147* (2006.01)
  *H01F 1/16* (2006.01)
  *H01F 41/02* (2006.01)
  *H10N 35/01* (2023.01)

(56) References Cited

U.S. PATENT DOCUMENTS

| | | | |
|---|---|---|---|
| 2015/0028724 A1* | 1/2015 | Summers | H10N 35/01 |
| | | | 148/543 |
| 2017/0317266 A1 | 11/2017 | Imai | |
| 2018/0233654 A1 | 8/2018 | Imai | |

FOREIGN PATENT DOCUMENTS

| | | | |
|---|---|---|---|
| JP | 2020-050543 A | | 4/2020 |
| JP | 2020158346 A | * | 10/2020 |
| WO | 2011/158473 A1 | | 12/2011 |

OTHER PUBLICATIONS

Clark A. E. et al., Extraordinary magnetoelasticity and lattice softening in bcc Fe—Ga alloys, Appl. Phys, 93(2003) 8621. (3 pages); cited in the specification.

Park J. et al., Stress-anneal-induced magnetic anisotropy in highly textured Fe-Ga and Fe-Al magnetostrictive strips for bending-mode vibrational energy harvesters, AIP Advances 6 056221 (2016). (7 pages); cited in the specification.

Ueno T., Energy Harvesting and Actuator Technology Using Magnetostrictive Material, Current Status and Prospective, Journal of the Japan Society of Precision Engineering, vol. 79, No. 4, p. 305-308, 2013, with English translation. (8 pages); cited in the specification.

International Search Report dated Apr. 5, 2022, issued in counterpart Application No. PCT/JP2022/004487, with English translation. (4 pages).

Notification of Transmittal of Translation of the International Preliminary Report on Patentability (Form PCT/IB/338) issued in counterpart International Application No. PCT/JP2022/004487 mailed Apr. 5, 2022 with Forms PCT/IB/373, PCT/ISA/237 and PCT/IB/326. (10 pages).

Extended (Supplementary) European Search Report dated May 7, 2025, issued in counterpart EP Application No. 22752700.9. (8 pages).

Zhou, C. et al., Improved magnetostriction in Galfenol alloys by aligning crystal growth direction along easy magnetization axis, Scientigic Reports, vol. 10, p. 1-7, Nov. 18, 2020. (8 pages); cited in Extended European Search Report dated May 7, 2025.

* cited by examiner

SINGLE CRYSTAL

THIN PLATE MEMBER

MAGNETOSTRICTIVE MEMBER

MAGNETOSTRICTIVE MEMBER AND METHOD FOR MANUFACTURING MAGNETOSTRICTIVE MEMBER

TECHNICAL FIELD

The present invention relates to a magnetostrictive member and a method for manufacturing a magnetostrictive member.

BACKGROUND ART

Magnetostrictive materials are attracting attention as functional materials. For example, Fe—Ga alloys, which are iron-based alloys, are materials exhibiting the magnetostrictive effect and the reverse magnetostrictive effect, showing a large magnetostriction of about 100 to 350 ppm. For this reason, in recent years, they have attracted attention as a material for vibration power generation in the energy harvesting field and are expected to be applied to wearable terminals and sensors. As a method for manufacturing a single crystal of an Fe—Ga alloy, a method for growing a single crystal by the pull-up method (the Czochralski method, hereinafter abbreviated as the "Cz method") is known (e.g., Patent Literature 1). In addition, as methods of manufacture other than the Cz method, the vertical Bridgman method (the VB method) and the vertical temperature gradient freeze method (the VGF method) are known (e.g., Patent Literature 2 and Patent Literature 3).

The Fe—Ga alloy has an easy axis of magnetization in the <100> orientation of the crystal and can exhibit large magnetic distortion in this orientation. Conventionally, magnetostrictive members of the Fe—Ga alloy have been manufactured by cutting a single crystal part oriented in the <100> orientation from an Fe—Ga polycrystal to a desired size (e.g., Non-Patent Literature 1); crystal orientation significantly affects magnetostrictive characteristics, and thus a single crystal in which the direction in which the magnetostriction of magnetostrictive members is required and the <100> orientation, in which the magnetic strain of the crystal is maximum, are matched with each other is considered to be optimum for the material of magnetostrictive members.

The single crystal of the Fe—Ga alloy exhibits positive magnetostriction when a magnetic field is applied in parallel to the <100> orientation of the single crystal (hereinafter referred to as a "parallel magnetostriction amount"). On the other hand, when a magnetic field is applied perpendicularly to the <100> orientation, negative magnetostriction is exhibited (hereinafter referred to as a "perpendicular magnetostriction amount"). As the intensity of the applied magnetic field is gradually increased, the parallel magnetostriction amount or the perpendicular magnetostriction amount is saturated. A magnetostriction constant ($3/2\lambda 100$) is determined by the difference between the saturated parallel magnetostriction amount and the saturated perpendicular magnetostriction amount and is determined by Expression (1) below (e.g., Patent Literature 4 and Non-Patent Literature 2).

$$3/2\lambda_{100} = \varepsilon(//) - \varepsilon(\perp) \quad \text{Expression (1)}$$

$3/2\lambda_{100}$: the magnetostriction constant $\varepsilon(//)$: the parallel magnetostriction amount when saturated by applying a magnetic field in parallel to the <100> direction $\varepsilon(\perp)$: the perpendicular magnetostriction amount when saturated by applying a magnetic field perpendicularly to the <100> direction The magnetostrictive characteristics of the Fe—Ga alloy are considered to affect the magnetostrictive and inverse magnetostrictive effects and the characteristics of magnetostrictive vibration power generation devices and are important parameters for device design (e.g., Non-Patent Literature 4). In particular, the magnetostriction constant depends on the Ga composition of the Fe—Ga alloy single crystal, and it is known that the magnetostriction constant reaches its maximum at Ga compositions of 18 to 19 at % and 27 to 28 at % (e.g., Non-Patent Literature 2), and it is desirable to use Fe—Ga alloys with such Ga concentrations for devices. Furthermore, in recent years, it has been reported that, in addition to the magnetostriction constant being large, a larger parallel magnetostriction amount tends to result in higher device characteristics such as output voltage (e.g., Non-Patent Literature 3).

A magnetostrictive vibration power generation device, for example, includes an Fe—Ga magnetostrictive member wound by a coil, as well as a yoke and a field permanent magnet (e.g., Patent Literature 5 and Non-Patent Literature 4). In this magnetostrictive vibration power generation device, as a mechanism, when the yoke as a movable part of the device is vibrated, the Fe—Ga magnetostrictive member fixed at the center of the yoke vibrates in tandem, the magnetic flux density of the coil wound on the Fe—Ga magnetostrictive member changes due to the reverse magnetostriction effect, and electromagnetic induction electromotive force is generated to generate power. In the magnetostrictive vibration power generation device, a force is applied in the long-side direction of the yoke to cause vibration, and thus the Fe—Ga magnetostrictive member for use in the device is desirably processed such that <100>, which is the easy axis of magnetization, is in the long-side direction.

CITATION LIST

Patent Literature

[Patent Literature 1] Japanese Unexamined Patent Application Publication No. 2016-28831

[Patent Literature 2] Japanese Unexamined Patent Application Publication No. 2016-138028

[Patent Literature 3] Japanese Unexamined Patent Application Publication No. 4-108699

[Patent Literature 4] Japanese Translation of PCT Application Publication No. 2015-517024

[Patent Literature 5] WO2011/158473

Non-Patent Literature

[Non-Patent Literature 1] Etrema, State of the Art of Galfenol Processing.

[Non-Patent Literature 2] A. E. Clark et al., Appl. Phys. 93 (2003) 8621.

[Non-Patent Literature 3] Jung Jin Park, Suok-Min Na, Ganesh Raghunath, and Alison B. Flatau. AIP Advances 6, 056221 (2016).

[Non-Patent Literature 4] Toshiyuki Ueno, Journal of Japan Society for Precision Engineering Vol. 79, No. 4, (2013) 305-308.

SUMMARY OF INVENTION

Technical Problem

The device characteristics of magnetostrictive vibration power generation devices or the like are affected by the magnetostrictive characteristics of the magnetostrictive member, and thus the magnetostrictive member is required to have high magnetostrictive characteristics and a small variation in the magnetostrictive characteristics. Given these circumstances, it has been believed that if the crystal orientation of the single crystal of the Fe—Ga alloy is <100> and the Ga concentration is uniform, a magnetostrictive member with a uniform magnetostriction constant can be obtained. However, as described in Non-Patent Literature 3, it is disclosed that the device characteristics are affected by the parallel magnetostriction amount as well as the magnetostriction constant. Examinations by the inventors of the present invention have revealed that the magnetostrictive member manufactured as described above has a variation in the parallel magnetostriction amount (or the perpendicular magnetostriction amount) even if the magnetostriction constant is uniform and that the magnetostriction constant itself varies.

Given these circumstances, an object of the present invention is to provide a magnetostrictive member having a high magnetostriction constant and a high parallel magnetostriction amount and small variations in the magnetostriction constant and the parallel magnetostriction amount among members and a method for manufacturing such a magnetostrictive member.

Solution to Problem

An aspect of the present invention provides a magnetostrictive member formed of a single crystal of an iron-based alloy having magnetostrictive characteristics, being a plate-like body having a long-side direction and a short-side direction, and having a lattice constant of a <100> orientation in the long-side direction not larger than a lattice constant average calculated from lattice constants of <100> orientations in three directions, or the long-side direction, the short-side direction, and a direction orthogonal to the long-side direction and the short-side direction.

An aspect of the present invention provides a magnetostrictive member formed of a single crystal of an iron-based alloy having magnetostrictive characteristics, being a plate-like body having a long-side direction and a short-side direction, and having a lattice constant of a <100> orientation in the long-side direction being minimum among lattice constants of <100> orientations in three directions, or the long-side direction, the short-side direction, and a direction orthogonal to the long-side direction and the short-side direction.

In the magnetostrictive member of an aspect of the present invention, the iron-based alloy may be an Fe—Ga alloy, the magnetostrictive member may have the lattice constant of the <100> orientation in the long-side direction of 2.9034 Å or less and have one of lattice constants of <100> orientations other than the long-side direction larger than the lattice constant of the <100> orientation in the long-side direction by 0.0006 Å or more, the magnetostrictive member may have a magnetostriction constant of 250 ppm or more, and the magnetostrictive member may have a parallel magnetostriction amount of 250 ppm or more, the parallel magnetostriction amount being a magnetostriction amount when a magnetic field parallel to the long-side direction is applied and a magnetostriction amount in the long-side direction is saturated. The thickness of the magnetostrictive member may be 0.3 mm or more and 2 mm or less.

An aspect of the present invention provides a method for manufacturing a magnetostrictive member formed of a single crystal of an iron-based alloy having magnetostrictive characteristics and having a shape having a long-side direction and a short-side direction, the method including cutting the single crystal such that a lattice constant of a <100> orientation in the long-side direction is not larger than a lattice constant average calculated from lattice constants of <100> orientations in three directions, or the long-side direction, the short-side direction, and a direction orthogonal to the long-side direction and the short-side direction.

An aspect of the present invention provides a method for manufacturing a magnetostrictive member formed of a single crystal of an iron-based alloy having magnetostrictive characteristics and having a shape having a long-side direction and a short-side direction, the method including cutting the single crystal such that a lattice constant of a <100> orientation in the long-side direction is minimum among lattice constants of <100> orientations in three directions, or the long-side direction, the short-side direction, and a direction orthogonal to the long-side direction and the short-side direction.

Advantageous Effects

The magnetostrictive member of an aspect of the present invention has the characteristics of a high magnetostriction constant and a high parallel magnetostriction amount and small variations in the magnetostriction constant and the parallel magnetostriction amount among members. The method for manufacturing a magnetostrictive member of an aspect of the present invention can easily manufacture a magnetostrictive member having a high magnetostriction constant and a high parallel magnetostriction amount and small variations in the magnetostriction constant and the parallel magnetostriction amount among members.

DESCRIPTION OF EMBODIMENTS

The following describes specific embodiments of the present invention in detail. The present invention is not limited to the following embodiments and can be modified as appropriate to the extent that the gist of the present invention is not changed. Part or the whole of each of the drawings is schematically described and is described on different scales as appropriate. In the following description, the description "A to B" means "A or more and B or less."

Embodiments

Figure 1:
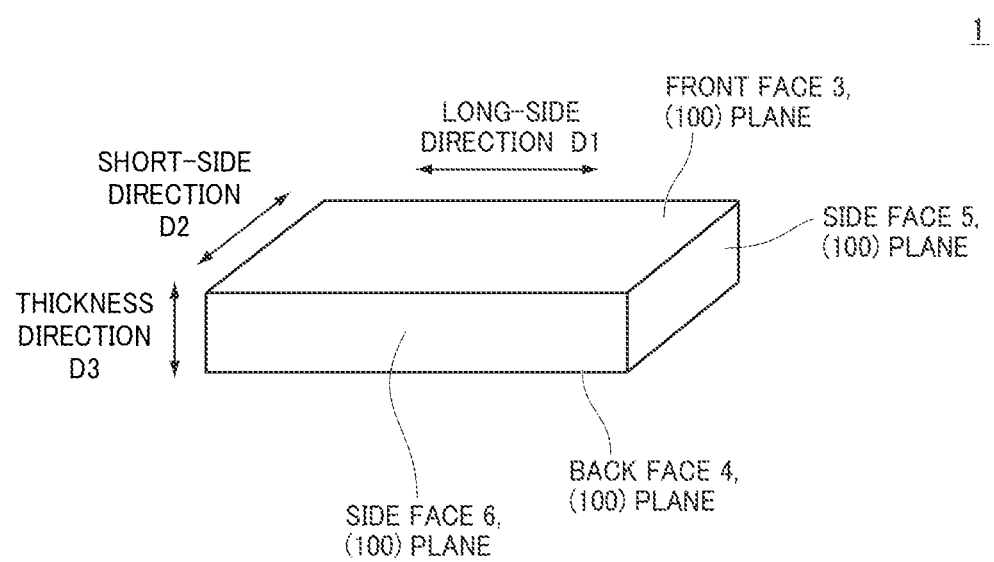
FIG. 1 is a diagram of an example of a magnetostrictive member according to an embodiment.

The following describes a magnetostrictive member and a method for manufacturing a magnetostrictive member of the present embodiment. The following first describes the magnetostrictive member of the present embodiment. FIG. 1 is a diagram of an example of the magnetostrictive member according to the embodiment. As illustrated in FIG. 1, this magnetostrictive member 1 is a plate-like body having a long-side direction D1 and a short-side direction D2. The plate-like body is a rectangular shape in a plan view. The plate-like body has a front face 3, a back face 4, and side faces 5 and 6. The front face 3 and the back face 4 are suitably parallel to each other but are not necessarily parallel to each other.

The magnetostrictive member 1 is formed of a crystal of an iron-based alloy. The iron-based alloy is not limited to a particular alloy so long as it has magnetostrictive characteristics. The magnetostrictive characteristics mean characteristics causing a shape change when a magnetic field is applied. The iron-based alloy is, for example, an alloy such as Fe—Ga, Fe—Ni, Fe—Al, Fe—Co, Tb—Fe, Tb—Dy—Fe, Sm—Fe, or Pd—Fe. The alloys may be alloys with a third component added. The Fe—Ga alloy, for example, may be an alloy with Ba, Cu, or the like added. Among these iron-based alloys, the Fe—Ga alloy has larger magnetostrictive characteristics and is easier to process than other alloys and thus has been applied to materials for vibration power generation in the energy harvesting field, wearable terminals, sensors, and the like. In the following description, an example of a configuration in which the magnetostrictive member 1 is formed of a single crystal of the Fe—Ga alloy will be described as an example of the magnetostrictive member 1.

The single crystal of the Fe—Ga alloy has a body-centered cubic lattice structure and is based on the fact that first to third <100> axes (see FIG. 4 to FIG. 6) of the directional indices in the Miller indices are equivalent and first to third {100} planes (see FIG. 4 to FIG. 6) of the plane indices in the Miller indices are equivalent (i.e., (100), (010), and (001) are equivalent). In addition, the Fe—Ga alloy has the characteristic of exhibiting large magnetic distortion in a specific orientation of the crystal. When this characteristic is used for a magnetostrictive vibration power generation device, it is desirable to match the direction in which the magnetostriction of the magnetostrictive member 1 is required in the device and the orientation (direction) in which the magnetic strain of the crystal is maximum with each other. Specifically, as described above, it is desirable to set the <100> direction, which is the easy direction of magnetization in the single crystal, to the long-side direction D1 of the magnetostrictive member 1. Setting the <100> direction, which is the easy direction of magnetization in the single crystal, to the long-side direction D1 of the magnetostrictive member 1 can be performed, for example, by calculating the crystal orientation of the single crystal by known crystal orientation analysis and cutting the single crystal on the basis of the calculated crystal orientation of the single crystal.

The magnetostrictive member 1 is used, for example, as materials (components) for vibration power generation devices in the energy harvesting field and materials (components) for wearable terminals, sensors, and the like. For example, the magnetostrictive vibration power generation device as disclosed in Patent Literature 5 above includes a coil, an Fe—Ga alloy magnetostrictive member wound by the coil, a yoke, and a field permanent magnet. In this magnetostrictive vibration power generation device, as a mechanism, when the yoke as a movable part of the device is vibrated, the magnetostrictive member fixed at the central part of the yoke vibrates in tandem, the magnetic flux density of the coil wound on the magnetostrictive member changes due to the reverse magnetostriction effect, and electromagnetic induction electromotive force is generated to generate power. When used on such a mechanism, it is suitable that the shape of the magnetostrictive member 1 is like a thin plate and is set to an elongated rectangular shape in a plan view. The thickness of the magnetostrictive member 1 is not limited to a particular thickness. The lower limit of the thickness is suitably 0.3 mm or more, more suitably 0.4 mm or more, and even more suitably 0.5 mm or more. The upper limit of the thickness of the magnetostrictive member 1 is suitably 2 mm or less, more suitably 1.8 mm or less, and even more suitably 1.5 mm or less. The thickness of the magnetostrictive member 1 is suitably 0.3 mm or more and 2 mm or less, more suitably 0.4 mm or more and 1.8 mm or less, and even more suitably 0.5 mm or more and 1.5 mm or less. The mechanism of power generation by the magnetostrictive member 1 is, as described above, a mechanism to generate power by the reverse magnetostriction effect by applying stress to the magnetostrictive member (vibration). When the thickness of the magnetostrictive member 1 is less than 0.3 mm, it is easily damaged during vibration. When the thickness of the magnetostrictive member 1 exceeds 2 mm, on the other hand, the stress due to vibration is required to be increased, resulting in lower efficiency. The shape and the size of the magnetostrictive member 1 are set as appropriate in accordance with the size of an objective device. For example, the size of the magnetostrictive member 1 includes a length (dimension) L1 in the long-side direction D1 of 16 mm, a width (dimension) L2 in the short-side direction D2 of 4 mm, and a thickness of 1 mm.

The shape and the dimensions of the magnetostrictive member 1 are not limited to particular ones. For example, the magnetostrictive member 1 need not be a rectangular shape in a plan view. For example, the shape of the magnetostrictive member 1 may be elliptic, track-shaped, or irregular in a plan view. When the shape of the magnetostrictive member 1 is other than the rectangular shape in a plan view, the long-side direction D1 is a long-diameter direction, a long-axis direction, or the like, whereas the short-side direction D2 is a direction orthogonal to the long-side direction D1.

As described above, the inventors of the present invention produced a plurality of plate-like magnetostrictive members formed of the single crystal of the Fe—Ga alloy, with the {100} plane as the principal plane, and with a rectangular shape in a plan view with the <100> direction, which is the easy direction of magnetization, as the long-side direction of the magnetostrictive member. Checking the magnetostrictive characteristics of the magnetostrictive members produced by being cut out of the single crystal of the Fe—Ga alloy with a uniform Ga concentration revealed that the produced magnetostrictive members had a large variation in the parallel magnetostriction amount, although they had a high-level magnetostriction constant. It was also found out that in these magnetostrictive members, the magnetostriction constant itself might vary and that the magnetostriction constant varied depending on the position at which the magnetostrictive member was cut out of the single crystal. After further examinations, it was also found out that the magnetostriction constant and the parallel magnetostriction amount were related to an inter-lattice distance of the single crystal in each direction. The present invention has been made on the basis of the above findings.

A magnetostrictive member is manufactured, for example, by cutting a grown crystal of an iron-based alloy in a certain direction to produce a thin plate-like member and then cutting the produced thin plate-like member into a predetermined size. Conventional magnetostrictive members have been subjected to polishing or the like on the front and back faces of the magnetostrictive members to finish the front and back faces to be smooth.

As illustrated in FIG. 1, the magnetostrictive member 1 of the present embodiment is formed of a single crystal of an iron-based alloy having magnetostrictive characteristics, is a plate-like body having a long-side direction and a short-side direction, and has a lattice constant of a <100> orientation in the long-side direction not larger than a lattice constant average calculated from lattice constants of <100> orientations in three directions, or the long-side direction, the short-side direction, and a direction orthogonal to the long-side direction and the short-side direction. The following gives a detailed description.

As described above, checking the magnetostrictive characteristics of the magnetostrictive members cut out of the Fe—Ga single crystal with a uniform Ga concentration reveals that they have a variation in the parallel magnetostriction amount and may have a variation in the magnetostriction constant itself, although they have a high-level magnetostriction constant. Given these circumstances, examinations have been performed on the magnetostriction constant and the parallel magnetostriction amount of the magnetostrictive member and the inter-lattice distance of the single crystal in each direction to find that they are related to each other.

Figure 2:
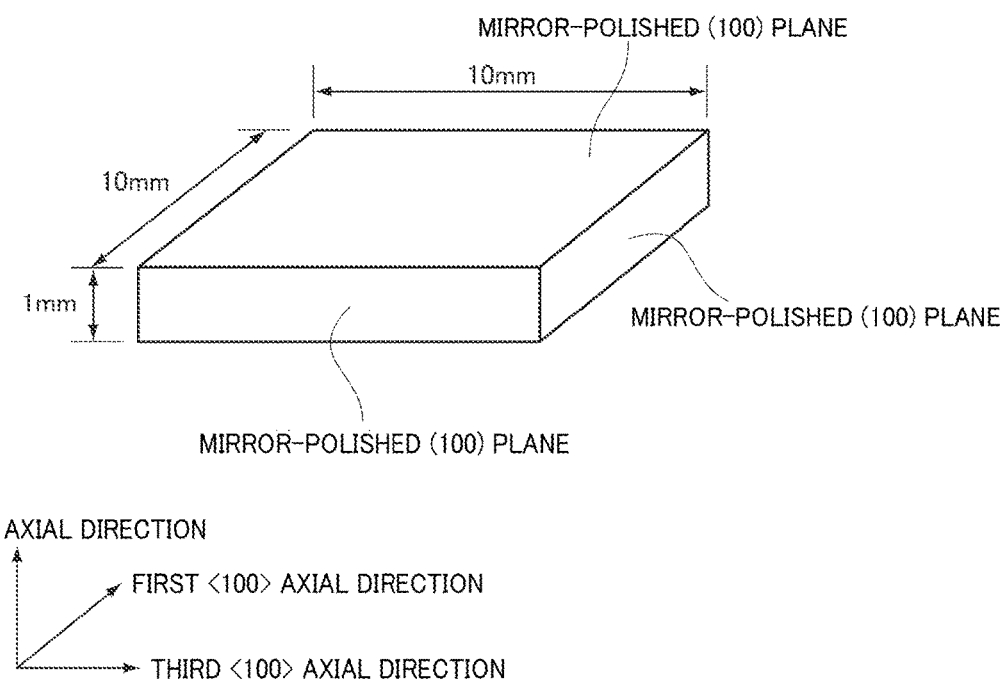
FIG. 2 is a schematic diagram of the magnetostrictive member processed to be 10 mm×10 mm×1 mm such that all six faces are {100} planes and mirror-polished faces.
Figure 4:
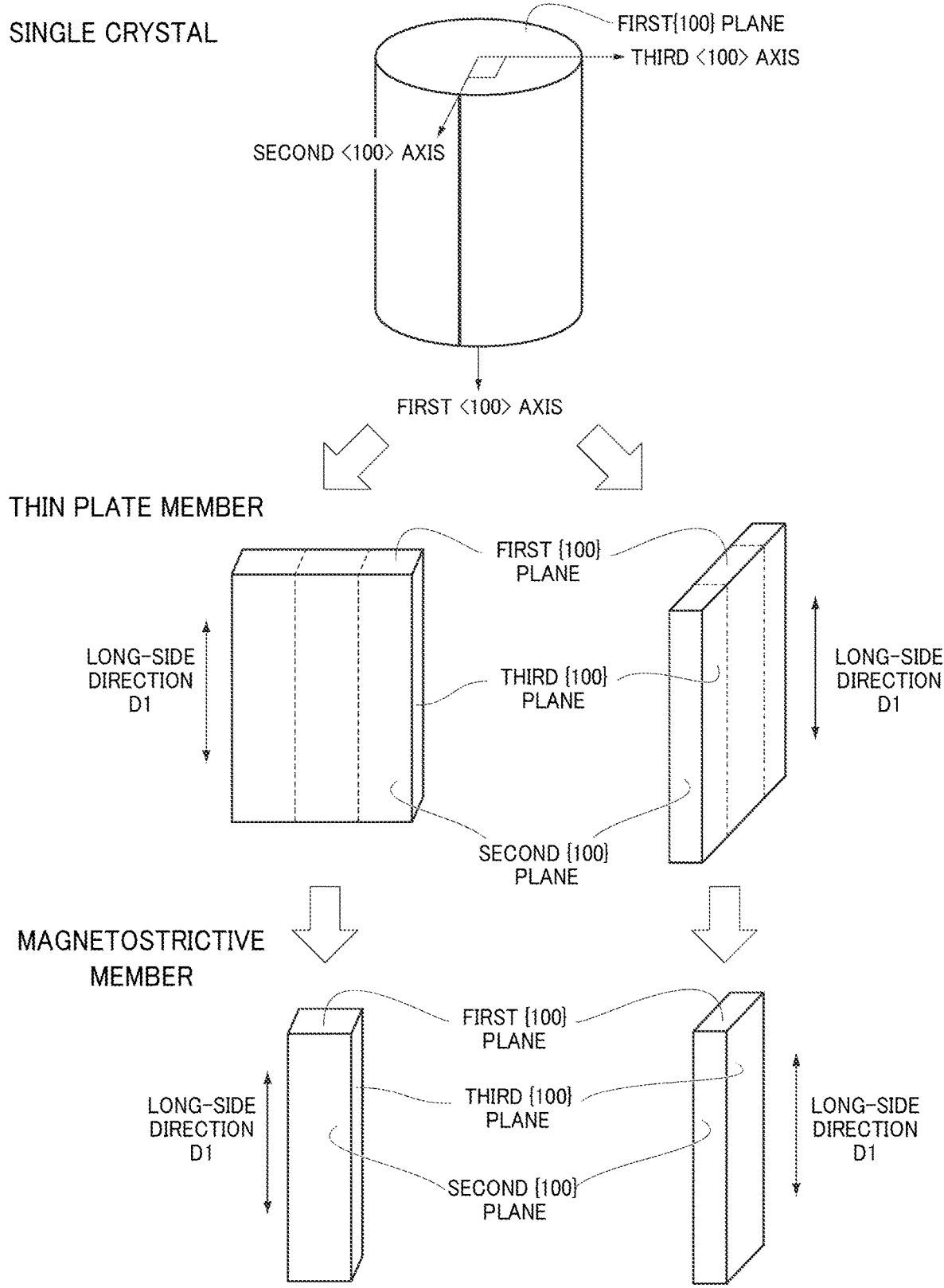
FIG. 4 is a diagram of a first example of a single crystal, a thin plate member, and a magnetostrictive member.

As illustrated in FIG. 4, a thin plate member was cut out of a grown single crystal so as to be parallel to a first <100> axial direction and parallel to a third <100> axial direction to produce a plurality of Samples A to F, which were examined. The production of the samples was performed by the following procedure. The thin plate member was produced by cutting the grown single crystal with a free abrasive grain type multi-wire saw so as to be parallel to the first <100> direction and parallel to the third <100> axial direction, which was cut so as to have a size of 10 mm×10 mm×1 mm illustrated in FIG. 2. Furthermore, the cut magnetostrictive member was mirror polished by 50 μm each per face for each face to make a magnetostrictive member sample.

To evaluate the lattice constants of (100) planes in three directions, for a total of three faces, or the front face and the two side faces, of the magnetostrictive member sample, using the X-ray diffraction of the (100) plane with a two-dimensional X-ray diffractometer (XRD), a (200) diffraction peak was used to measure a diffraction angle 2θ, a d value was calculated from the diffraction angle, and further the d value was doubled to calculate the lattice constant. As a result, it was confirmed that the lattice constants in the three directions were not constant and asymmetric. It has been conventionally thought that the first to third <100> axes of the directional indices in the Miller indices are equivalent because Fe—Ga alloys have a body-centered cubic lattice structure. However, in the crystals actually grown, it has been found that there are differences in the lattice constants in the three directions, or the first to third <100> axial directions (hereinafter also abbreviated as "lattice constants in the three directions"). Furthermore, it has been found that there are differences in a lattice constant trend even among samples in the same thin plate member of the same crystal. Table 1 lists detailed results. It is thought from these results that the variation in the lattice constant is the cause of the variation in the magnetostrictive characteristics. For the average of the lattice constants, the volume of a unit lattice with the lattice constants in the three directions multiplied is equivalent regardless of the crystal site, and thus the value that is the cubic root of the volume of the unit lattice is defined as the average of the lattice constants.

Next, for Samples A to F, a strain gauge was attached to the surface of the magnetostrictive member sample to measure the magnetostriction constant and the parallel magnetostriction amount in the growth axis direction and the third <100> axial direction. Table 1 lists the results. The measurement of the magnetostriction constant and the parallel magnetostriction amount was performed in the same manner as in Example 1 described below.

TABLE 1

| | Lattice constant (Å) | | | | Magnetostriction amount in first axial direction (ppm) | | | Magnetostriction amount in third axial direction (ppm) | | |
|---|---|---|---|---|---|---|---|---|---|---|
| | First axial direction (growth direction) | Third axial direction | Second axial direction (thickness direction) | Average | Magnetostriction constant (ppm) | Parallel magnetostriction amount (ppm) | Ratio | Magnetostriction constant (ppm) | Parallel magnetostriction amount (ppm) | Ratio |
| Sample A | 2.9035 | 2.9032 | 2.9042 | 2.9036 | 284 | 257 | 90% | 283 | 282 | 100% |
| Sample B | 2.903 | 2.9026 | 2.9037 | 2.9031 | 292 | 241 | 83% | 290 | 279 | 96% |
| Sample C | 2.9021 | 2.9036 | 2.9038 | 2.9032 | 286 | 282 | 99% | 295 | 160 | 54% |
| Sample D | 2.902 | 2.9038 | 2.9031 | 2.9030 | 297 | 295 | 99% | 299 | 13 | 4% |
| Sample E | 2.903 | 2.9033 | 2.9043 | 2.9035 | 288 | 281 | 98% | 301 | 281 | 93% |
| Sample F | 2.9017 | 2.9029 | 2.904 | 2.9029 | 291 | 284 | 98% | 288 | 280 | 97% |

As can be seen from Table 1, it can be seen that there are differences in the magnitude of the lattice constants in the respective axial directions of the magnetostrictive member in the samples obtained by processing the grown crystal into the thin plate member and then into magnetostrictive members. In Sample A and Sample B, there is a tendency that the lattice constant in the third <100> axial direction is smaller and the lattice constant in the thickness direction (the second <100> axial direction) is larger. In Sample C, Sample E, and Sample F, there is a tendency that the lattice constant in the first <100> axial direction (the growth axis direction) is smaller and the lattice constant in the thickness direction (the second <100> axial direction) is larger. In Sample D, there is a tendency that the lattice constant in the first <100> axial direction (the growth axis direction) is smaller and the lattice constant in the third <100> axial direction is larger. For the samples as a whole, there is a tendency that the maximum lattice constant is in the second <100> axial direction.

When the magnetostrictive characteristics of these samples are compared between the first <100> axial direction (the growth axis direction) and the third <100> axial direction, in Sample A and Sample B, there is no significant difference in the magnetostriction constant, but there is a tendency in the parallel magnetostriction amount that the parallel magnetostriction amount in the third <100> axial direction is slightly larger than that in the first <100> axial direction. In Sample C, there is a tendency in the parallel magnetostriction amount that the parallel magnetostriction amount in the first <100> axial direction is larger than that in the third <100> axial direction. In Sample E and Sample F, as to the parallel magnetostriction amount, the parallel magnetostriction amounts in the first <100> axial direction and the third <100> axial direction were comparable at a high level. In sample D, it can be seen that the parallel magnetostriction amount in the first <100> axial direction is at a high level, but the parallel magnetostriction amount in the third <100> axial direction is at an extremely low level.

From the above results, there is a relation between the lattice constant and the magnetostrictive characteristics, and from the results of Sample D and Sample C, there is a tendency that when the direction with a larger lattice constant is the direction of measuring the parallel magnetostriction amount, the parallel magnetostriction amount is smaller. On the other hand, it can be seen that there is a tendency that when the direction with a smaller lattice constant than an average of the lattice constants in the respective directions is the direction of measuring the parallel magnetostriction amount, the parallel magnetostriction amount is stable at a high level. In particular, it can be seen that by making the direction with the minimum value among the lattice constants in the respective directions the direction of measuring the parallel magnetostriction amount, the parallel magnetostriction amount is stable at a high level.

The magnetostrictive member is rectangular in a plan view and has a long-side direction and a short-side direction. In general, the magnetostrictive member changes its magnetostrictive characteristics by applying deformation in this long-side direction. Thus, the magnetostriction amount is suitably set so as to be maximum in the long-side direction of the magnetostrictive member. Given these circumstances, from the above results, the magnetostrictive member of the present embodiment is configured with a lattice constant of a <100> orientation in the long-side direction of the magnetostrictive member not larger than a lattice constant average calculated from lattice constants of <100> orientations in three directions, or the long-side direction, the short-side direction, and a direction orthogonal to the long-side direction and the short-side direction. Also from the above results, the magnetostrictive member of the present embodiment is configured with a lattice constant of a <100> orientation in the long-side direction being minimum among lattice constants of <100> orientations in three directions, or the long-side direction, the short-side direction, and a direction orthogonal to the long-side direction and the short-side direction.

Table 2 and Table 3 list examples of magnetostrictive members with lattice constants specified from the above results. By making the lattice constant of the <100> orientation in the long-side direction of the magnetostrictive members not larger than the lattice constant average calculated from the lattice constants of the <100> orientations in the three directions, or the long-side direction, the short-side direction, and the direction orthogonal to the long-side direction and the short-side direction, the magnetostriction constant and the parallel magnetostriction amount are stable at a high level.

The following describes the characteristics of the magnetostrictive member 1. The magnetostrictive member 1 of the present embodiment can have a magnetostriction constant of 200 ppm or more and suitably 250 ppm or more by the above configuration. The magnetostrictive member 1 can have a parallel magnetostriction amount of 200 ppm or more and suitably 250 ppm or more by the above configuration. When the magnetostriction constant and the parallel magnetostriction amount of the magnetostrictive member 1 are in the above ranges, the magnetostrictive member 1 is suitably formed of a single crystal of an Fe—Ga alloy. The magnetostrictive member 1 of the present embodiment can be manufactured with both the magnetostriction constant and the parallel magnetostriction amount at a high level and with reduced variations among members. For example, the magnetostrictive member 1 of the present embodiment can have a parallel magnetostriction amount in the long-side direction D1 of 80% or more and suitably 90% or more of the magnetostriction constant.

From the viewpoint of making both the magnetostriction constant and the parallel magnetostriction amount at a high level and reducing variations among members, as shown in the examples, the magnetostrictive member 1 has a lattice constant of the <100> orientation in the long-side direction of 2.9034 Å or less, more suitably 2.9032 Å or less, more suitably 2.9030 Å or less, and more suitably 2.9024 Å or less and has one of lattice constants of <100> orientations other than the long-side direction suitably larger than the lattice constant of the <100> orientation in the long-side direction by 0.0006 Å or more, more suitably larger by 0.0008 Å or more, more suitably larger by 0.0010 Å or more, and more suitably larger by 0.0013 Å or more.

The single crystals in this example are crystals grown by the VB method, and the growing conditions were almost the same from the early stage of growth to the end of growth. However, as described above, depending on the position at which the magnetostrictive member is cut out of the single crystal, the lattice constants vary in the respective directions. In this example, the lattice constant at a position at which the magnetostrictive member is cut out of a plurality of grown single crystals was checked. As a result, although there was a variation in the lattice constant, the direction of a minimum value had a similar tendency depending on the position at which the magnetostrictive member was cut out of the single crystals. It is particularly stable in the early stage of growth and near the end of growth. In contrast, near the central part of the crystal (part with a solidification rate of 50% to 60%), there are differences in the axial direction of the minimum value of the lattice constant, and the axial direction with the minimum value of the lattice constant is not stable. Thus, the central part of the crystal (a solidification rate of 50% to 60%) may be deleted as needed.

In the present invention, when the lattice constants in the respective directions can be predicted in advance by the position at which the magnetostrictive member is cut out of the single crystal as described above, the magnetostrictive member may be cut out of the single crystal on the basis of the prediction without checking the lattice constants in the respective directions.

The magnetostrictive characteristics of the magnetostrictive member are affected by surface processing strain, and thus the parallel magnetostriction amount is suitably mirror-polished finishing. When measuring the lattice constant, the surface to be measured must have a mirror-polished finished face. For this reason, the surface of the magnetostrictive member of the present invention is suitably mirror-polished finishing. As described above, when the lattice constants in the respective directions can be predicted in advance by the position at which the magnetostrictive member is cut out of the single crystal, the magnetostrictive member may be cut out of the single crystal on the basis of the prediction without checking the lattice constants in the respective directions. In such a case, the surface of the magnetostrictive member is not required to be mirror-polished finishing and may be a processed face not affecting the magnetostrictive characteristics. For example, it may be an electric discharge processed face or the like. The side faces of the magnetostrictive member may be processed faces such as electric discharge processing or wire saw processing because the method of processing for the side faces has little effect on the magnetostrictive characteristics.

The following describes a method for manufacturing a magnetostrictive member of the present embodiment. The method for manufacturing a magnetostrictive member of the present embodiment is a method for manufacturing the magnetostrictive member 1 of the present embodiment described above. The method for manufacturing a magnetostrictive member of the present embodiment is a method for manufacturing a magnetostrictive member formed of a single crystal of an iron-based alloy having magnetostrictive characteristics and having a shape having a long-side direction and a short-side direction, the method including cutting the single crystal such that a lattice constant of a <100> orientation in the long-side direction is not larger than a lattice constant average calculated from lattice constants of <100> orientations in three directions, or the long-side direction, the short-side direction, and a direction orthogonal to the long-side direction and the short-side direction. The method for manufacturing a magnetostrictive member of the present embodiment may include cutting the single crystal such that a lattice constant of a <100> orientation in the long-side direction is minimum among lattice constants of <100> orientations in three directions, or the long-side direction, the short-side direction, and a direction orthogonal to the long-side direction and the short-side direction. In the following description, a method for manufacturing the magnetostrictive member 1 from a single crystal ingot of an Fe—Ga alloy will be described as an example, but the method for manufacturing a magnetostrictive member of the present embodiment is not limited to the following description. It is assumed that any description in the present specification that is applicable to the method for manufacturing the magnetostrictive member of the present embodiment is also applicable to the method for manufacturing a magnetostrictive member of the present embodiment.

Figure 3:
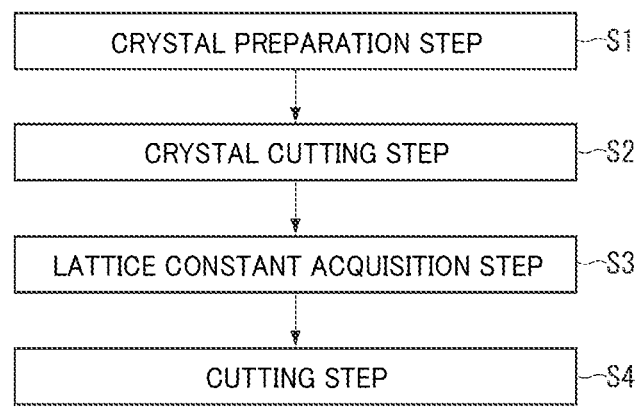
FIG. 3 is a flowchart of an example of a method for manufacturing a magnetostrictive member according to the embodiment.
Figure 5:
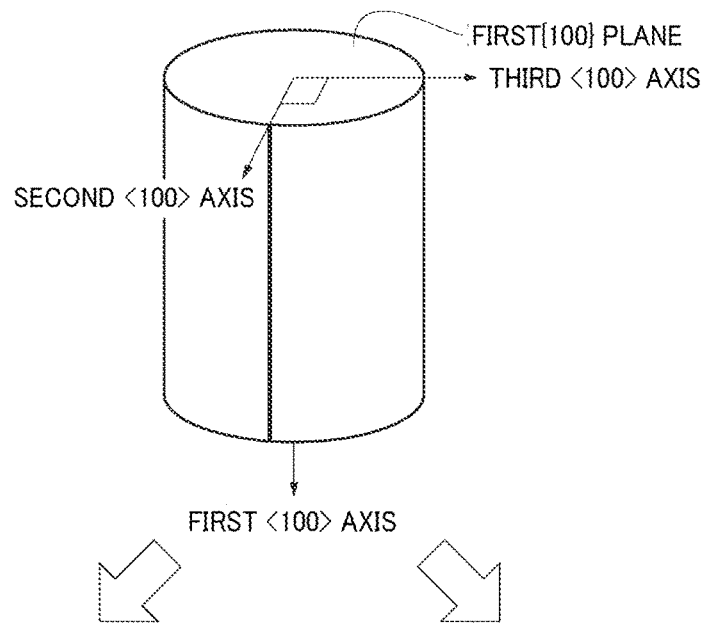
FIG. 5 is a diagram of a second example of the single crystal, the thin plate member, and the magnetostrictive member.
Figure 5:
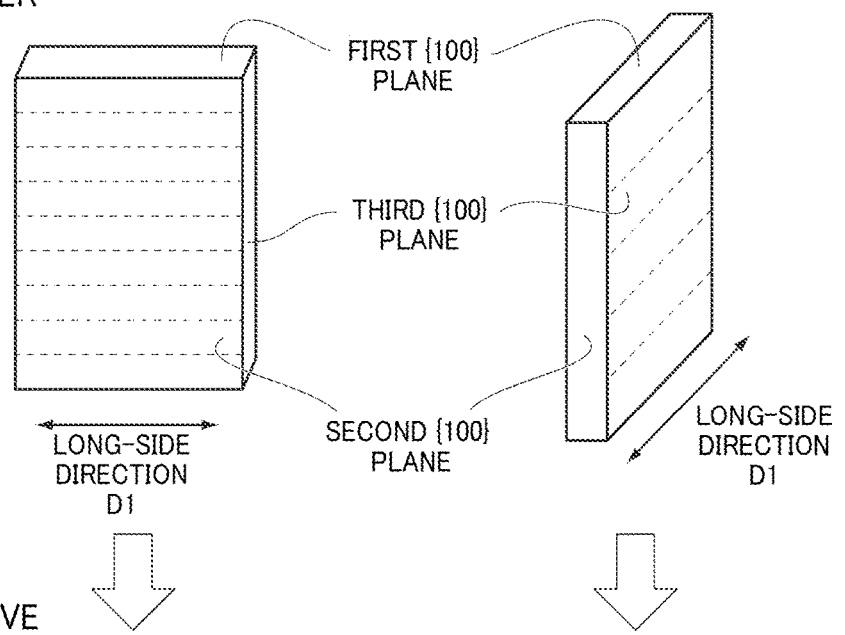
Figure 5:
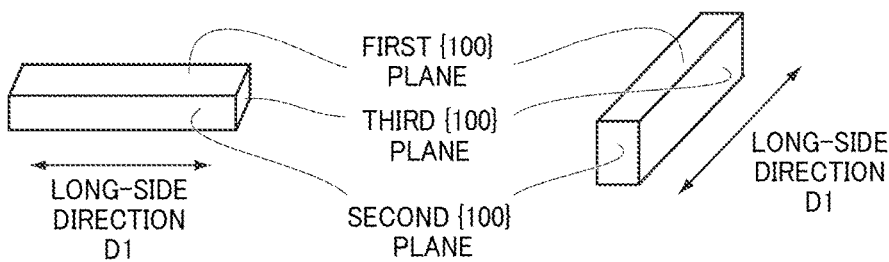
Figure 6:
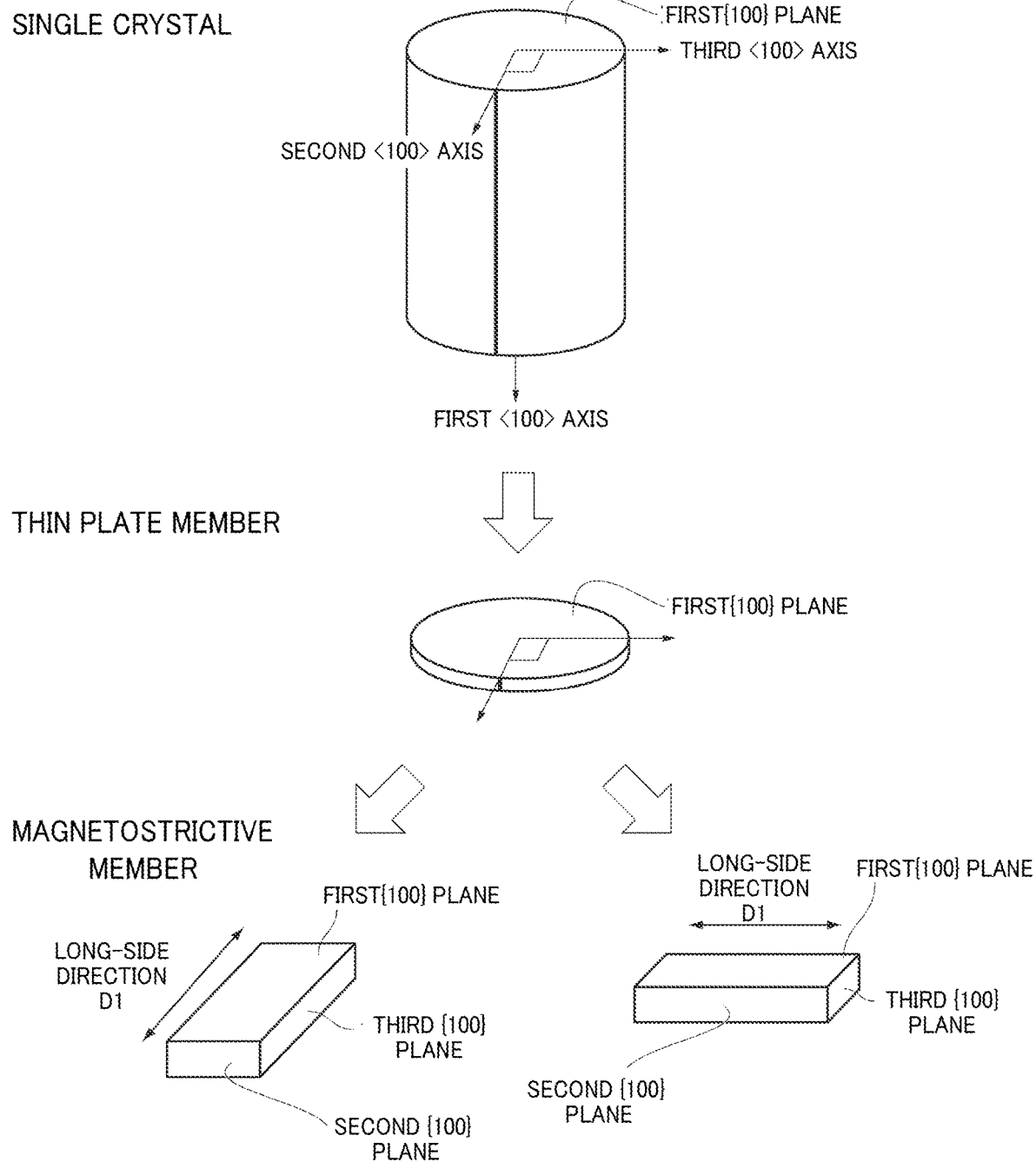
FIG. 6 is a diagram of a third example of the single crystal, the thin plate member, and the magnetostrictive member.

FIG. 3 is a flowchart of an example of the method for manufacturing a magnetostrictive member of the embodiment. FIG. 4 to FIG. 6 are diagrams of first to third examples of a single crystal, a thin plate member, and a magnetostrictive member. This method for manufacturing a magnetostrictive member of the present embodiment includes a crystal preparation step (Step S1), a crystal cutting step (Step S2), a lattice constant acquisition step (Step S3), and a cutting step (Step S4).

In the method for manufacturing a magnetostrictive member of the present embodiment, first, in the crystal preparation step (Step S1), a crystal of an iron-based alloy having magnetostrictive characteristics is prepared. The single crystal to be prepared may be a grown one or a commercially available one. For example, in the crystal preparation step, a single crystal of an Fe—Ga alloy is prepared. The method for growing the single crystal of the Fe—Ga alloy is not limited to a particular method. The method for growing the single crystal of the Fe—Ga alloy may be, for example, the pull-up method or the unidirectional solidification method. For example, the Cz method can be used as the pull-up method, and the VB method, the VGF method, the micro pull-down method, and the like can be used as the unidirectional solidification method.

For the single crystal of the Fe—Ga alloy, the magnetostriction constant is maximized by setting a content of gallium to 18.5 at % or 27.5 at %. For this reason, the single crystal of the Fe—Ga is grown so as to have a content of gallium of suitably 16.0 to 20.0 at % or 25.0 to 29.0 at % and more suitably 17.0 to 19 at % or 26.0 to 28.0 at %. The shape of the grown single crystal is not limited to a particular shape and may be cylindrical or quadrangular prismatic, for example. The grown single crystal may be made into a columnar single crystal by cutting a seed crystal, a diameter-increased part, a shoulder part (a part with an increased diameter from the seed crystal to a predetermined single crystal), or the like with a cutting apparatus, if necessary. The size of the single crystal to be grown is not limited to a particular size so long as it is large enough to ensure the magnetostrictive member in a predetermined direction. When the Fe—Ga single crystal is grown, it is grown using a seed crystal processed with the upper face or the lower face of the seed crystal to be the {100} plane so that the growth axis direction is <100>. In the Fe—Ga alloy single crystal to be grown, the crystal is grown in a direction perpendicular to the upper face or the lower face of the seed crystal, and the orientation of the seed crystal is inherited.

Following the crystal preparation step (Step S1), the crystal cutting step (Step S2) is performed. The crystal cutting step is a step cutting the crystal to produce a thin plate member. The thin plate member is a member to be the material of the magnetostrictive member 1 of the present embodiment. The crystal cutting step is a step, for example, cutting the single crystal of the Fe—Ga alloy having magnetostrictive characteristics using a cutting apparatus to produce the thin plate member with the {100} plane as its principal plane. As the cutting apparatus, a cutting apparatus such as a wire electric discharge machine, an inner peripheral blade cutting apparatus, or a wire saw can be used. Among these, the use of a multi-wire saw is particularly suitable because it can cut a plurality of thin plate members at the same time. The cutting direction of the single crystal in the case of the Fe—Ga single crystal is the <100> direction, and cutting is performed such that a cut plane, that is, the principal plane of the thin plate member is the {100} plane. The cutting direction of the single crystal is not limited to a particular direction so long as it is any of the three <100> directions. The cutting direction may be a perpendicular direction or a parallel direction with respect to the growing direction of the single crystal (the direction in which the crystal is grown) as illustrated in FIG. 4 to FIG. 6, for example.

Following the crystal cutting step (Step S2), the lattice constant acquisition step (Step S3) is performed. The lattice constant acquisition step is a step acquiring the lattice constants in the above-described three directions, or first to third <100> axial directions. The method for obtaining the lattice constants is not limited to a particular method so long as it is a method capable of acquiring the lattice constants in the three directions, and known methods can be used. For example, as described above, they can be acquired by using the X-ray diffraction of the (100) plane with the two-dimensional X-ray diffractometer (XRD), calculating the d value from the diffraction angle, and further doubling the d value. When measuring the lattice constants, the face to be measured is suitably finished to a mirror-polished face. The lattice constant varies depending on the position at which it is cut out of the single crystal, and thus it is desirable to perform measurement with a measurement position changed a plurality of times.

Following the lattice constant acquisition step (Step S3), the cutting step (Step S4) is performed. The cutting step is a step cutting the thin plate member of the single crystal on the basis of the lattice constants acquired in the lattice constant acquisition step to obtain the magnetostrictive member 1 of the present embodiment.

In the cutting step, the thin plate member of the single crystal is cut such that the lattice constant of the <100> orientation of the magnetostrictive member 1 in the long-side direction D1 is not larger than the lattice constant average of the <100> orientations in the three directions. Thus, the magnetostrictive member 1 of the present embodiment can be obtained.

In the cutting step, the thin plate member of the single crystal may be cut such that the lattice constant of the <100> orientation in the long-side direction D1 is minimum among the lattice constants of the <100> orientations in the three directions, or the long-side direction D1, the short-side direction D2, and the direction D3 (the thickness direction) orthogonal to the long-side direction D1 and the short-side direction D2. Thus, the magnetostrictive member 1 of the present embodiment can be obtained.

Although there is a variation in the lattice constant depending on the position at which the magnetostrictive member is cut out of the single crystal, it is found that the trend of the variation in the lattice constant depending on the position at which the magnetostrictive member is cut out of the single crystal obtained by the same method of manufacture is similar. Thus, in the present invention, when the lattice constants in the respective directions can be predicted in advance by the position at which the magnetostrictive member is cut out of the single crystal, the lattice constant acquisition step (Step S3) may be omitted.

That is, the magnetostrictive member 1 of the present embodiment obtained by the above cutting step is formed of a single crystal of an iron-based alloy having magnetostrictive characteristics, is a plate-like body having the long-side direction and the short-side direction, and has the lattice constant of the <100> orientation in the long-side direction D1 not larger than a lattice constant average calculated from the lattice constants of the <100> orientations in the three directions, or the long-side direction D1, the short-side direction D2, and the direction D3 (the thickness direction D3) orthogonal to the long-side direction D1 and the short-side direction D2. The magnetostrictive member 1 of the present embodiment obtained by the above cutting step may have the lattice constant of the <100> orientation in the long-side direction D1 being minimum among the lattice constants of the <100> orientations in the three directions, or the long-side direction D1, the short-side direction D2, and the direction D3 (the thickness direction) orthogonal to the long-side direction D1 and the short-side direction D2.

As described above, the magnetostrictive member 1 of the present embodiment is formed of a single crystal of an iron-based alloy having magnetostrictive characteristics, is a plate-like body having the long-side direction and the short-side direction, and has the lattice constant of the <100> orientation in the long-side direction D1 not larger than a lattice constant average calculated from the lattice constants of the <100> orientations in the three directions, or the long-side direction D1, the short-side direction D2, and the direction D3 (the thickness direction D3) orthogonal to the long-side direction D1 and the short-side direction D2. The magnetostrictive member 1 of the present embodiment is formed of a single crystal of an iron-based alloy having magnetostrictive characteristics, is a plate-like body having the long-side direction and the short-side direction, and has the lattice constant of the <100> orientation in the long-side direction D1 being minimum among the lattice constants of the <100> orientations in the three directions, or the long-side direction D1, the short-side direction D2, and the direction D3 (the thickness direction) orthogonal to the long-side direction D1 and the short-side direction D2. In the magnetostrictive member of the present embodiment, any configuration other than the above is optional. The magnetostrictive member of the present embodiment has a high magnetostriction constant and a high parallel magnetostriction amount and small variations in the magnetostriction constant and the parallel magnetostriction amount among members.

The method for manufacturing a magnetostrictive member of the present embodiment is a method for manufacturing a magnetostrictive member formed of a single crystal of an iron-based alloy having magnetostrictive characteristics and having a shape having a long-side direction and a short-side direction, the method including cutting the single crystal such that a lattice constant of a <100> orientation in the long-side direction D1 is not larger than a lattice constant average calculated from lattice constants of <100> orientations in three directions, or the long-side direction D1, the short-side direction D2, and the direction D3 (the thickness direction D3) orthogonal to the long-side direction D1 and the short-side direction D2. The method for manufacturing a magnetostrictive member of the present embodiment is a method for manufacturing a magnetostrictive member formed of a single crystal of an iron-based alloy having magnetostrictive characteristics and having a shape having a long-side direction and a short-side direction, the method including cutting a thin plate member of the single crystal such that a lattice constant of a <100> orientation in the long-side direction D1 is minimum among lattice constants of <100> orientations in three directions, or the long-side direction D1, the short-side direction D2, and the direction D3 (the thickness direction) orthogonal to the long-side direction D1 and the short-side direction D2. In the method for manufacturing a magnetostrictive member of the present embodiment, any configuration other than the above is optional. The method for manufacturing a magnetostrictive member of the present embodiment can provide a high magnetostriction constant and a high parallel magnetostriction amount and reduce variations in the magnetostriction constant and the parallel magnetostriction amount among members.

EXAMPLES

The following specifically describes the present invention with reference to examples, but the present invention is not limited by these examples in any manner.

Examples 1 to 6

With raw materials adjusted with a stoichiometric ratio of iron to gallium of 81:19, a cylindrical single crystal of an Fe—Ga alloy grown by the vertical Bridgman (VB) method was prepared. The growth axis direction of the single crystal was <100>. In the {100} plane of the upper face or the lower face of the single crystal perpendicular to the crystal growth axis direction, the orientation was confirmed by X-ray diffraction. In this process, upper face and lower face samples of the crystal were measured with a Shimadzu sequential plasma emission spectrometer (ICPS-8100), and the concentration of the single crystal had a content of gallium of 17.5 to 19.0 at %.

A magnetostrictive member was manufactured from the grown single crystal as follows. First, using a free abrasive grain type wire saw apparatus, the single crystal was cut in a direction parallel to the single crystal growth direction (parallel to the <100> orientation) to produce a thin plate member with a cut plane, that is, a principal plane of {100}. Next, surface grinding was performed on the front face and the back surfaces of the obtained thin plate member to adjust the thickness of the thin plate member. Subsequently, mirror finishing was applied to each face of the obtained thin plate member.

The lattice constants were evaluated for the three <100> axial directions, or the long-side direction, the short-side direction, and the thickness in the mirror-finished thin plate member. Using a two-dimensional X-ray diffractometer D8 DISCOVER (manufactured by Bruker), the lattice constants were evaluated by measuring a diffraction angle 2θ using a (200) diffraction peak to calculate a d value and then doubling the d value. The lattice constants in the three directions were multiplied, and the cube root thereof was calculated to be an average of the lattice constants.

Subsequently, the magnetostrictive member with a size including a dimension in the long-side direction of 16 mm×a dimension in the short-side of 4 mm×a thickness of 1 mm was cut out of the thin plate member. The thin plate member was cut into a size including a dimension in the long-side direction of 16 mm×a dimension in the short-side of 4 mm×a thickness of 1 mm with an outer peripheral blade cutting apparatus to obtain the magnetostrictive member of the present embodiment. Cutting out the magnetostrictive member from the thin plate member was performed such that the lattice constant of the magnetostrictive member after cutting out satisfies the following (Condition 1) or (Condition 2) on the basis of the acquired lattice constants of the <100> axes in the three directions.

(Condition 1) The lattice constant of the <100> orientation in the long-side direction D1 is not larger than a lattice constant average calculated from the lattice constants of the <100> orientations in the three directions, or the long-side direction D1, the short-side direction D2, and the direction D3 (the thickness direction D3) orthogonal to the long-side direction D1 and the short-side direction D2.

(Condition 2) The lattice constant of the <100> orientation in the long-side direction D1 is minimum among the lattice constants of the <100> orientations in the three directions, or the long-side direction D1, the short-side direction D2, and the direction D3 (the thickness direction) orthogonal to the long-side direction D1 and the short-side direction D2.

Figure 7:
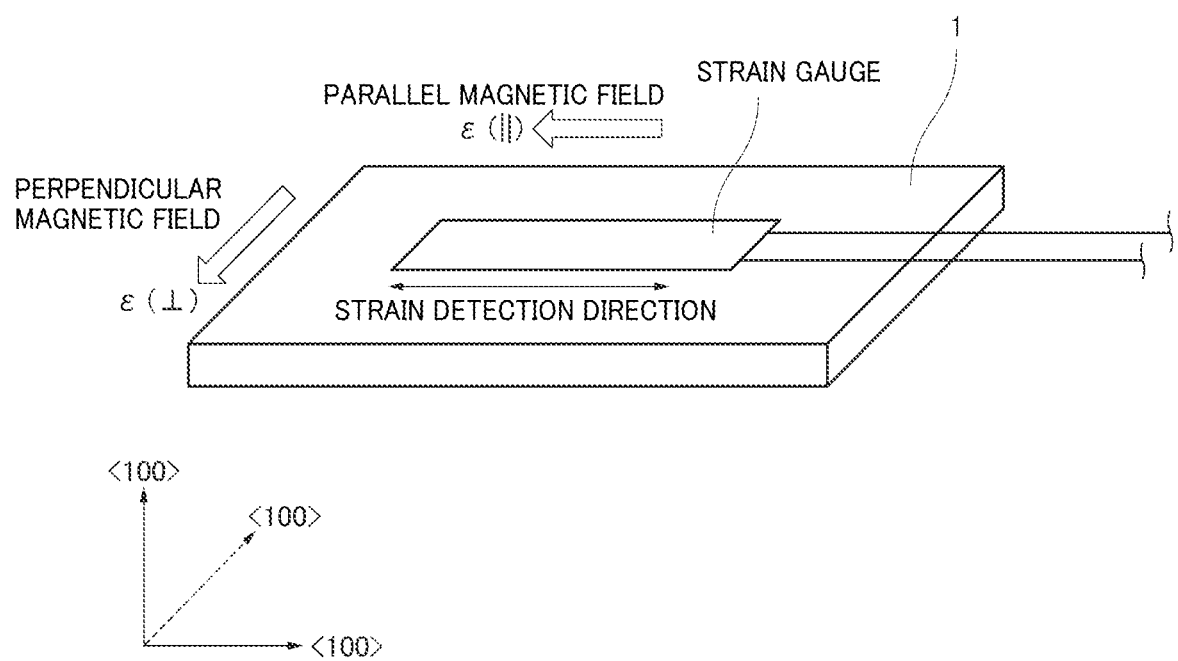
FIG. 7 is a diagram of a strain gauge method used in examples.

Next, magnetostrictive characteristics were measured for the selected magnetostrictive member. Measurement of the magnetostrictive characteristics was performed by the strain gauge method. As illustrated in FIG. 7, a strain gauge (manufactured by Kyowa Electronic Instruments Co., Ltd.) was bonded to the {100} plane, which is the principal plane of the manufactured magnetostrictive member, using adhesive. The long-side direction of the strain gauge is a magnetostriction detection direction, and thus the strain gauge was bonded such that its long-side direction was parallel to the long-side direction of the magnetostrictive member and the <100> orientation.

A magnetostriction measuring instrument (manufactured by Kyowa Electronic Instruments Co., Ltd.) included a neodymium-based permanent magnet, a bridge box, a compact recording system, a strain unit, and dynamic data acquisition software.

The magnetostriction amount was determined by correcting an actual strain detection value by a gauge factor.

The gauge factor was determined by Expression (3) below.

$$\varepsilon = 2.00/Ks \times \varepsilon i \qquad \text{Expression (3)}$$

(ε: the gauge factor, εi: a measured strain value, Ks: the gauge factor of the used gauge)

The magnetostriction amount when the magnetic field direction was parallel to the long-side direction of the strain gauge was defined as the parallel magnetostriction amount. On the other hand, the magnetostriction amount when the magnetic field direction was perpendicular to the long-side direction of the strain gauge was defined as the perpendicular magnetostriction amount. The magnetostriction constant was determined by the difference between the parallel magnetostriction amount and the perpendicular magnetostriction amount in accordance with Expression (1). Table 2 lists the manufacturing conditions and the evaluation results. As listed in Table 2, the magnetostriction constant was 271 ppm to 291 ppm. The parallel magnetostriction amount was 222 ppm to 289 ppm. The lattice constant of the <100> orientation in the long-side direction was 2.9019 Å to 2.9032 Å. "The lattice constant average calculated from the lattice constants of the <100> orientations in the three directions, or the long-side direction D1, the short-side direction D2, and the direction D3 (the thickness direction D3) orthogonal to the long-side direction D1 and short-side direction D2" was 2.9030 Å to 2.9037 Å.

"Difference" in Table 2 and Table 3 is a value obtained by subtracting "the lattice constant in the long-side direction" from "the maximum value of the lattice constants in a direction other than the long-side direction among the three directions of the lattice constants of the <100> axes in the three directions." The value shown in the unit of "ppm" in the "Difference" column (344 ppm in the case of Example 1) is a value obtained by converting a value obtained by dividing the above "difference" by "the lattice constant in the long-side direction" into ppm. As listed in Table 2, the ratio indicating the magnetostriction constant/the parallel magnetostriction amount (unit %) was 82% to 101%. "Difference" indicating the value obtained by subtracting "the lattice constant in the long-side direction" from "the maximum value of the lattice constants in a direction other than the long-side direction among the three directions of the lattice constants of the <100> axes in the three directions" was 0.0006 to 0.0022 Å and 207 ppm to 758 ppm in terms of ppm as listed in Table 2. The difference between "the lattice constant average calculated from the lattice constants of the <100> orientations in the three directions, or the long-side direction D1, the short-side direction D2, and the direction D3 (the thickness direction D3) orthogonal to the long-side direction D1 and short-side direction D2" and "the lattice constant of the <100> orientation in the long-side direction" was 0.0003 Å to 0.0011 Å.

TABLE 2

| | Long-side direction | Dimensions (mm) | | | Lattice constant (Å) | | | | | Magnetostriction constant (ppm) | Magnetostriction amount in long-side direction | |
| | | Long-side | Short-side | Plate thickness | Long-side | Short-side | Front face | Average | Difference | | Parallel magnetostriction amount (ppm) | Ratio |
|---|---|---|---|---|---|---|---|---|---|---|---|---|
| Example 1 | Third axial direction | 16 | 4 | 1 | 2.9032 | 2.9036 | 2.9042 | 2.9037 | 0.0010 (344 ppm) | 284 | 282 | 99% |
| Example 2 | Third axial direction | 16 | 4 | 1 | 2.9024 | 2.9044 | 2.9038 | 2.9035 | 0.0020 (689 ppm) | 291 | 283 | 97% |
| Example 3 | First axial direction | 16 | 4 | 1 | 2.9022 | 2.9038 | 2.9032 | 2.9031 | 0.0016 (551 ppm) | 287 | 289 | 101% |
| Example 4 | First axial direction | 16 | 4 | 1 | 2.9030 | 2.9033 | 2.9043 | 2.9035 | 0.0013 (448 ppm) | 289 | 272 | 94% |
| Example 5 | First axial direction | 16 | 4 | 1 | 2.9019 | 2.9029 | 2.9041 | 2.9030 | 0.0022 (758 ppm) | 281 | 274 | 98% |
| Example 6 | Third axial direction | 16 | 4 | 1 | 2.9032 | 2.9038 | 2.9035 | 2.9035 | 0.0006 (207 ppm) | 271 | 222 | 82% |

Comparative Examples 1 to 4

These were performed such that in Example 1, the lattice constant in the magnetostrictive member after cutting out satisfied neither (Condition 1) nor (Condition 2) above. Other than this, the same process as in Example 1 was performed to manufacture and evaluate magnetostrictive members. Table 3 lists the manufacturing conditions and the evaluation results. As listed in Table 3, the magnetostriction constant was 281 ppm to 291 ppm. The parallel magnetostriction amount was 51 ppm to 179 ppm. The lattice constant of the <100> orientation in the long-side direction was 2.9038 Å to 2.9042 Å. "The lattice constant average calculated from the lattice constants of the <100> orientations in the three directions, or the long-side direction D1, the short-side direction D2, and the direction D3 (the thickness direction D3) orthogonal to the long-side direction D1 and short-side direction D2" was 2.9030 Å to 2.9036 Å. The ratio indicating the magnetostriction constant/the parallel magnetostriction amount (unit %) was 18% to 62% as listed in Table 3. "Difference" indicating the value obtained by subtracting the "lattice constant in the long-side direction" from "the maximum value of the lattice constants in a direction other than the long-side direction among the three directions of the lattice constants of the <100> axes in the three directions" was −0.0012 to 0.0003 and −413 ppm to 103 ppm in terms of ppm as listed in Table 3.

Conclusion

From the results of the examples and the comparative examples, it is confirmed that the lattice constants of the {100} planes in the three directions are asymmetric due to residual strain in the crystal. It is considered that this is because the magnetization direction is located in the <100> direction having a larger lattice constant. From the results of the examples and the comparative examples, it is confirmed that a magnetostrictive material with a large parallel magnetostriction amount can be obtained by processing so as to satisfy the condition 1 or the condition 2 above. From the results of the examples and the comparative examples, it is confirmed that the magnetostrictive member 1 of the present embodiment has the characteristics of a high magnetostriction constant and a high parallel magnetostriction amount and small variations in the magnetostriction constant and the parallel magnetostriction amount among members. From the results of the examples, it is confirmed that the method for manufacturing a magnetostrictive member of the present embodiment can easily manufacture a magnetostrictive member having a high magnetostriction constant and a high parallel magnetostriction amount and small variations in the magnetostriction constant and the parallel magnetostriction amount among members.

TABLE 3

| | Long-side direction | Dimensions (mm) | | | Lattice constant (Å) | | | | | Magnetostriction constant (ppm) | Magnetostriction amount in long-side direction | |
| | | Long-side | Short-side | Plate thickness | Long-side | Short-side | Front face | Average | Difference | | Parallel magnetostriction amount (ppm) | Ratio |
|---|---|---|---|---|---|---|---|---|---|---|---|---|
| Comparative Example 1 | Second axial direction | 16 | 4 | 1 | 2.9038 | 2.9041 | 2.9022 | 2.9034 | 0.0003 (103 ppm) | 291 | 179 | 62% |
| Comparative Example 2 | Second axial direction | 16 | 4 | 1 | 2.9041 | 2.9029 | 2.9019 | 2.9030 | −0.0012 (−413 ppm) | 289 | 128 | 44% |
| Comparative Example 3 | Third axial direction | 16 | 4 | 1 | 2.9042 | 2.9031 | 2.9036 | 2.9036 | −0.0006 (−207 ppm) | 285 | 51 | 18% |
| Comparative Example 4 | Third axial direction | 16 | 4 | 1 | 2.9039 | 2.9024 | 2.9037 | 2.9033 | −0.0002 (−69 ppm) | 281 | 143 | 51% |

The technical scope of the present invention is not limited to the aspects described in the embodiments and the like described above. One or more of the requirements described in the embodiments and the like described above may be omitted. The requirements described in the embodiments and the like described above can be combined as appropriate. To the extent permitted by law, the disclosure of Japanese Patent Application No. 2021-019133, which is a Japanese patent application, and all the references cited in the embodiments and the like described above is incorporated herein by reference.

DESCRIPTION OF REFERENCE SIGNS

1 Magnetostrictive member
3 Front face
4 Back face
5, 6 Side face
D1 Long-side direction
D2 Short-side direction

The invention claimed is:

1. A magnetostrictive member
formed of a single crystal of an iron-based alloy having magnetostrictive characteristics,
being a plate body having a long-side direction and a short-side direction, and
having a lattice constant of a <100> orientation in the long-side direction not larger than a lattice constant average calculated from lattice constants of <100> orientations in three directions, or the long-side direction, the short-side direction, and a direction orthogonal to the long-side direction and the short-side direction, wherein
the iron-based alloy is an Fe—Ga alloy, and
the magnetostrictive member has the lattice constant of the <100> orientation in the long-side direction of 2.9034 Å or less and has one of lattice constants of <100> orientations other than the long-side direction larger than the lattice constant of the <100> orientation in the long-side direction by 0.0006 Å or more.

2. The magnetostrictive member according to claim 1, formed of a single crystal of an iron-based alloy having magnetostrictive characteristics,
being a plate body having a long-side direction and a short-side direction, and
having a lattice constant of a <100> orientation in the long-side direction being minimum among lattice constants of <100> orientations in three directions, or the long-side direction, the short-side direction, and a direction orthogonal to the long-side direction and the short-side direction.

3. The magnetostrictive member according to claim 1, wherein
the magnetostrictive member has a magnetostriction constant of 250 ppm or more, and
the magnetostrictive member has a parallel magnetostriction amount of 250 ppm or more, the parallel magnetostriction amount being a magnetostriction amount when a magnetic field parallel to the long-side direction is applied and a magnetostriction amount in the long-side direction is saturated.

4. The magnetostrictive member according to claim 1, wherein a thickness of the plate body is 0.3 mm or more and 2 mm or less.

5. A method for manufacturing the magnetostrictive member of claim 1, the method comprising cutting the single crystal such that a lattice constant of a <100> orientation in the long-side direction is not larger than a lattice constant average calculated from lattice constants of <100> orientations in three directions, or the long-side direction, the short-side direction, and a direction orthogonal to the long-side direction and the short-side direction, wherein
the iron-based alloy is an Fe—Ga alloy, and
the magnetostrictive member has the lattice constant of the <100> orientation in the long-side direction of 2.9034 Å or less and has one of lattice constants of <100> orientations other than the long-side direction larger than the lattice constant of the <100> orientation in the long-side direction by 0.0006 Å or more.

6. The method according to claim 5, wherein the single crystal is cut such that a lattice constant of a <100> orientation in the long-side direction is minimum among lattice constants of <100> orientations in three directions, or the long-side direction, the short-side direction, and a direction orthogonal to the long-side direction and the short-side direction.

* * * * *